US008682638B2

(12) United States Patent
Mlinarsky et al.

(10) Patent No.: US 8,682,638 B2
(45) Date of Patent: Mar. 25, 2014

(54) CHANNEL EMULATOR SYSTEM AND METHOD

(75) Inventors: Fanny Mlinarsky, Bolton, MA (US); Samuel J. MacMullan, Carlisle, MA (US)

(73) Assignee: Octoscope, Inc., Littleton, MA (US)

( * ) Notice: Subject to any disclaimer, the term of this patent is extended or adjusted under 35 U.S.C. 154(b) by 185 days.

(21) Appl. No.: 13/135,267

(22) Filed: Jun. 30, 2011

(65) Prior Publication Data

US 2013/0006601 A1      Jan. 3, 2013

(51) Int. Cl.
*H04B 17/00* (2006.01)
*H04W 24/06* (2009.01)
*G06F 17/50* (2006.01)
*G06F 11/273* (2006.01)

(52) U.S. Cl.
CPC .............. *H04B 17/009* (2013.01); *H04W 24/06* (2013.01); *G06F 17/5022* (2013.01); *G06F 11/273* (2013.01)
USPC .......... 703/23; 703/3; 703/4; 703/5; 702/124; 375/224; 375/226; 375/227

(58) Field of Classification Search
CPC ................................................ H04B 17/009
USPC .................... 703/23, 3, 4, 5; 702/124, 77, 79; 375/224, 226, 227, 261; 455/67.11–67.16
See application file for complete search history.

(56) References Cited

U.S. PATENT DOCUMENTS

| | | | | |
|---|---|---|---|---|
| 7,054,781 | B2 * | 5/2006 | Kolu et al. | 702/122 |
| 7,636,653 | B1 * | 12/2009 | Chan et al. | 703/14 |
| 7,698,121 | B2 * | 4/2010 | Steenkiste et al. | 703/23 |
| 8,045,935 | B2 * | 10/2011 | Lakkis et al. | 455/91 |
| 2003/0236089 | A1 * | 12/2003 | Beyme et al. | 455/423 |
| 2006/0229018 | A1 * | 10/2006 | Mlinarsky et al. | 455/67.11 |
| 2006/0229020 | A1 * | 10/2006 | Mlinarsky et al. | 455/67.14 |
| 2006/0241929 | A1 * | 10/2006 | Ferris | 703/23 |
| 2008/0123756 | A1 * | 5/2008 | Daniels et al. | 375/260 |
| 2009/0122899 | A1 * | 5/2009 | Kolu et al. | 375/267 |
| 2010/0285753 | A1 * | 11/2010 | Foegelle | 455/67.12 |
| 2011/0124295 | A1 * | 5/2011 | Mahjoubi Amine et al. | 455/67.14 |
| 2011/0188595 | A9 * | 8/2011 | Ylitalo | 375/267 |
| 2011/0270567 | A1 * | 11/2011 | Mow et al. | 702/120 |
| 2011/0280188 | A1 * | 11/2011 | Jeon et al. | 370/328 |
| 2011/0299570 | A1 * | 12/2011 | Reed | 375/130 |
| 2012/0071107 | A1 * | 3/2012 | Falck et al. | 455/67.12 |
| 2012/0106526 | A1 * | 5/2012 | Yousefi et al. | 370/338 |
| 2012/0225624 | A1 * | 9/2012 | Kyosti et al. | 455/67.11 |

OTHER PUBLICATIONS

Mandke, Ketan, et al. "Early Results on Hydra: A Flexible MAC/PHY Multihop Testbed" Vehicular Technology Conference 2007-Spring. IEEE 65th, pp. 1896-1900 (2007) available from <http://ieeexplore.ieee.org/xpls/abs_all.jsp?arnumber=4212821>.*

(Continued)

*Primary Examiner* — Kamini S. Shah
*Assistant Examiner* — Jay B Hann
(74) *Attorney, Agent, or Firm* — Intrinsic Law Corp; Ibrahim M. Hallaj

(57) ABSTRACT

Channel emulation in a PC computing platform including at least one general purpose parallel processor (GPPP) includes defining a plurality of fading channels in a GPPP and generating complex tap coefficients in a GPPP for the fading channels.

41 Claims, 17 Drawing Sheets

(56) References Cited

OTHER PUBLICATIONS

Poutanen, Torsti; Kolu, Janne "Correlation Control in the Multichannel Fading Simulators" IEEE Vehicular Technology Conference, pp. 318-322 (2001) available from <http://ieeexplore.ieee.org/xpls/abs_all.jsp?arnumber=944856>.*

Kolu, Janne; et al. "Real Time Simulation of Measured Radio Channels" IEEE Vehicular Technology Conference (2003) available from <http://ieeexplore.ieee.org/xpls/abs_all.jsp?arnumber=1285003>.*

Falconer, David; et al. "Chapter 6: New Air-Interface Technologies and Deployment Concepts" Technologies for the Wireless Future: Wireless World Research Forum (WWRF), vol. 2, pp. 131-226 (2006).*

Tsukamoto, Satoshi; et al. "A Complex Baseband Platform for Spatial-Temporal Mobile Radio Channel Simulations" IEEE Transactions on Vehicular Technology, vol. 51, No. 6, pp. 989-997 (2002) available from <http://ieeexplore.ieee.org/xpls/abs_all.jsp?arnumber=1105937>.*

Kolu, Janne; Jamsa, Tommi "A Real-Time Simulator for MIMO Radio Channels" IEEE Wireless Personal Multimedia Communications, vol. 2, pp. 568-572 (2002) available from <http://ieeexplore.ieee.org/xpls/abs_all.jsp?arnumber=1088238>.*

IEEE "IEEE Wireless LAN Edition: A compilation based on IEEE Std 802.11™-1999 (R2003) and its amendments" (2003).*

* cited by examiner

Packet structure

CHANNEL EMULATOR SYSTEM AND METHOD

FIELD OF THE INVENTION

This invention relates to an improved channel emulator system and method.

BACKGROUND OF THE INVENTION

A channel emulator is a specialized piece of electronic test equipment that emulates propagation of radio-waves based on well-defined environmental conditions. Channel emulators have been available for many years. Examples include the Spirent SR5500 and the Elektrobit Propsim. A channel emulator can emulate a reproducible set of environmental conditions that allows the verification of radio performance, as well as comparative evaluation of different radios under identical (emulated) propagation conditions. Traditional channel emulators were designed for conventional radios, now referred to as single input single output (SISO) radios. A SISO channel emulator models a single fading channel between a transmitter and a receiver by emulating multipath and Doppler fading in a multitude of predefined environmental conditions described by channel models. Multipath is a phenomenon whereby a transmit signal reflects from multiple surfaces and arrives at the receiver in the form of a sum of multiple delayed versions of itself. Multiple versions of the same transmit signal add together either constructively or destructively, resulting in time-variable signal attenuation known as multipath fading. Mobile reflectors or mobile radios introduce time-variable Doppler fading, which is a function of velocity of the reflectors or radios.

A channel emulator typically models both multipath and Doppler fading according to established statistical channel models. The delay spread of multipath reflections is a function of the size of the physical environment being modeled. Delay spread is narrower for small spaces (e.g. a small office) and wider for large spaces (e.g. outdoor environments). Doppler fading exhibits a higher frequency spread (rate of change) for fast-moving reflectors (e.g. high speed train) and a lower frequency spread for slow-moving reflectors (e.g. walking people).

A typical channel emulator downconverts the RF signal transmitted by a device under test (DUT), digitizes this signal into a stream of in-phase and quadrature (IQ) samples and mathematically processes the IQ streams according to a selected multipath and Doppler fading model. The resulting signal is then upconverted and coupled into the receiving device under test (DUT).

Modern 2-way data communications devices, including 802.11n and $3^{rd}$ generation partnership project (3GPP) long term evolution (LTE) radios, use multiple input multiple output (MIMO) technology. A MIMO radio is composed of multiple receive and transmit chains operating in phase lock and capable of sophisticated radio transmission techniques designed to increase data throughput and operating range of wireless links. A MIMO link is typically described as an N×M link, where N is the number of transmit chains in a transmitting radio and M is the number of receive chains in the receiving radio. In a MIMO link each of the M receive chains detects signals from all of the N transmit chains. Thus, a MIMO channel emulator must model N times M fading channels (as compared to a SISO emulator that models only one fading channel). Each fading channel is typically implemented as a tapped delay line (TDL) structure, as shown in FIG. 2. In prior art channel emulator implementations the number of fading channels grows exponentially with the number of ports. For example a 2×2 MIMO channel emulator implements 4 fading channels, as shown in FIG. 3. A 4×4 MIMO channel emulator implements 16 fading channels, as shown in FIG. 4.

A unidirectional MIMO channel emulator for an N×M MIMO system has N receive and M transmit ports. The transmitting DUT connects to the N receive input ports of the channel emulator and a receiving DUT connects to the M transmit output ports. If the channel being modeled is bidirectional, a channel emulator typically duplicates the circuitry in the forward and reverse direction to accommodate 2-way transmission between the DUTs, as shown in FIG. 5. The DUT RF ports are typically bidirectional with RF circulators separating transmit from receive signals.

In prior art implementations the amount of computing hardware required to implement a multiport channel emulator grows exponentially with the number of ports because there is a full mesh of computationally intensive fading channels interconnecting any port to all the other ports. Channel models, specifying the time-variable tap coefficients for the TDL multipliers and correlation of these coefficients, are defined by industry standards from organizations such as 3GPP and IEEE. Channel models can also be defined by end users or recorded for real environments using channel sounding techniques.

Modeling channel impairments requires real-time high performance computing hardware, particularly for high order MIMO systems where the number of fading channels scales exponentially with the number of ports in the system. For this reason current channel emulators are expensive and bulky. Most emulators on the market today are derived from earlier and much simpler SISO emulators that only model a single fading channel. Prior art emulators use large and costly Field Programmable Gate Arrays (FPGAs) such as Altera Stratix and Xilinx Virtex devices. These components usually add tens of thousands of dollars to the channel emulator cost and require several processing boards and interfaces that result in a large system size. The cost of these components was justifiable for a single-fading-channel SISO topology in a relatively young low-volume wireless market. Presently, though, with high port count MIMO channel emulator requirements, the now mature and much bigger wireless industry requires a scalable and less expensive architecture for channel emulation. Prior art channel emulator technology, if scaled to support modern high order MIMO systems, can cost as much as $1-2 million dollars. The high cost of channel emulators prohibits their widespread use. A company or research institution may have to forgo testing over realistic channels, or it may resort to time-sharing a small number of expensive channel emulators.

SUMMARY OF INVENTION I

In accordance with various aspects of the subject invention, in at least one embodiment, the invention presents improved channel emulation which eliminates the need for FPGAs and is much lower in cost, smaller and flexibly programmable to accommodate a variety of emulator topologies and models.

The subject invention results from the realization that, in part, an improved channel emulation system in various aspects can be achieved with a PC computing platform configured to provide a plurality of fading channels and complex tap coefficient generation logic for generating tap coefficients for the fading channels.

The subject invention, however, in other embodiments, need not achieve all these objectives and the claims hereof should not be limited to structures or methods capable of achieving these objectives.

This invention features a channel emulator system including a PC computing platform configured to provide a plurality of fading channels and complex tap coefficient generation logic generating tap coefficients for the fading channels.

In a preferred embodiment the channel emulator system may further include a user interface and controller to configure fading channels and coefficient generation logic according to selected channel model and topology configuration. The PC computing platform may include a general purpose parallel processor (GPPP) and the GPPP may be configured to provide the plurality of fading channels and the complex tap coefficient generation logic. The PC computing platform may include a GPPP and the GPPP may be configured to provide the plurality of fading channels, the complex tap coefficient generation logic and the user interface and controller. The PC computing platform may include a CPU and the user interface and controller may be implemented in the CPU. Each of the fading channels may include a tapped delay line. The channel emulator system may further include switch logic for routing IQ samples from channel emulator input ports to the fading channels and from the fading channels to channel emulator output ports. The switch logic may include ingress switch logic for routing IQ samples from the input ports to the fading channels and egress switch logic for routing IQ samples from the fading channels to the output ports. The PC computing platform may include a GPPP and the switch logic may be implemented with the GPPP. The ingress switch may include an IQ packetizer associated with each the input port. Each packetizer may receive a data stream of IQ samples and groups them into packets of IQ samples, and may apply a source address, a destination address and time stamp to each packet of IQ samples. Each packetizer may create one or more packets with the same group of IQ samples and the same time stamp but with one or more different destination addresses, each destination address designating a different fading channel. The ingress switch logic may further include switch fabric implemented in a GPPP for receiving the packets from the packetizers and routing packets according to the source and destination addresses to the designated fading channels. The egress switch logic may further include addressers associated with each fading channel and implemented in a GPPP, each addresser may replace the source address in the packets with the address of the fading channel for which it is instantiated and replaces the destination address with the address of at least one designated output port according to topology configuration. The egress switch logic may further include switch fabric implemented in a GPPP for routing packets in accordance with source and destination addresses. The channel emulator system may further include an IQ depacketizer associated with each output port. Each depacketizer may extract the IQ samples from each packet, sum them in accordance with the time stamp and reassemble the summed IQ samples for delivery to the destination output port. The channel emulator system may further include a time to frequency to time domain converter associated with the fading channels. The time to frequency to time domain converter may include Fourier Transform logic for converting the time domain IQ samples to frequency domain and Inverse Fourier Transform logic for converting frequency domain IQ samples to time domain. The Fourier Transform logic may include FFT logic and the Inverse Fourier Transform logic may include IFFT logic. The PC computing platform may include a GPPP and the time to frequency to time domain converter may be implemented in the GPPP. The PC computing platform may generate time domain representations of tap coefficients from channel model specification and may convert them to frequency domain coefficients. The user interface and controller may configure the switch logic to set topology configuration This invention also features a method of channel emulation in a PC computing platform including at least one GPPP including defining a plurality of fading channels in a GPPP and generating complex tap coefficients in a GPPP for the fading channels.

In a preferred embodiment the method of channel emulation may further include configuring switch logic in a the GPPP for setting topology configuration. Setting topology configuration may include routing IQ samples from channel emulator input ports to fading channels and from fading channels to channel emulator output ports. The method of channel emulation may further include packetizing IQ samples from each input port. Packetizing may include grouping a data stream of IQ samples into packets and applying a source address, a destination address, and a time stamp to each packet of IQ samples. The packets may be routed according to the source and destination addresses to the designated fading channels. Packets from the fading channels may be reconfigured by an addresser implemented in a GPPP with the source address of the fading channel and the destination address of at least one designated output port according to topology configuration. The packets may be routed by switch fabric implemented in a GPPP in accordance with the source and destination addresses. The method of channel emulation may further include depacketizing IQ samples associated with each output port. Depacketizing may include extracting the IQ samples from each packet, summing them in accordance with the time stamp and reassembling the summed IQ samples for delivery to the addressed output port. The method of channel emulation may further include configuring the complex tap coefficients in the GPPP to implement a channel model. Configuring the complex tap coefficients may include applying them to a tapped delay line. The method of channel emulation may further include converting time domain IQ samples from input ports to frequency domain and providing them to the fading channels and recognizing frequency domain IQ samples from fading channels, summing the IQ samples from multiple fading channels bound for the same output port and having the same time stamp, converting each sum of IQ samples to time domain and providing time domain IQ samples to emulator output ports. Converting time domain IQ samples to frequency domain and converting frequency domain to time domain may include performing Fourier transforms and inverse Fourier transforms, respectively. The method of channel emulation may further include programming, through a user interface and controller implemented in a CPU in a PC computing platform, the configuring of the complex tap coefficients to implement a selected channel model and the configuring of the switch logic for constructing a selected topology configuration.

This invention also features a MIMO/OTA channel emulator system including a PC computing platform configured to provide a plurality of fading channels, complex tap coefficient generation logic generating tap coefficients for the fading channels and a number of antenna elements each the antenna element interconnected with one or more of the fading channels.

In a preferred embodiment the channel emulator system may further include a user interface and controller to configure fading channels and coefficient generation logic according to selected channel model and topology configuration.

The PC computing platform may include a GPPP and the GPPP may be configured to provide the plurality of fading channels and the complex tap coefficient generation logic. The PC computing platform may include a GPPP and the GPPP may be configured to provide the plurality of fading channels, the complex tap coefficient generation logic and the user interface and controller. The PC computing platform may include a CPU and the user interface and controller may be implemented in the CPU. Each of the fading channels may include a tapped delay line. The channel emulator system may further include switch logic for routing IQ samples from channel emulator input ports to the fading channels and from the fading channels to channel emulator output ports. The switch logic may include ingress switch logic for routing IQ samples from the input ports to the fading channels and egress switch logic for routing IQ samples from the fading channels to the output ports. The PC computing platform may include a GPPP and the switch logic may be implemented with the GPPP. The ingress switch may include an IQ packetizer associated with each the input port. Each packetizer may receive a data stream of IQ samples and may group them into packets of IQ samples, and may apply a source address, a destination address and time stamp to each packet of IQ samples. The packetizer may create one or more packets with the same group of IQ samples and the same time stamp but with one or more different destination addresses each destination address designating a different fading channel. The ingress switch logic may further include switch fabric implemented in a GPPP for receiving the packet streams from the packetizers and routing packets according to the source and destination addresses to the designated fading channels. The egress switch logic may further include addressers associated with each fading channel and implemented in a GPPP, each addresser may replace the source address in the packets with the address of the fading channel for which it is instantiated and may replace the destination address field with the address of at least one designated output port according to topology configuration. The egress switch logic may further include switch fabric implemented in a GPPP for routing packets in accordance with source and destination addresses. The channel emulator system may further include an IQ depacketizer associated with each output port. Each depacketizer may extract the IQ samples from each packet, sum them in accordance with the time stamp and reassemble the summed IQ samples for delivery to the addressed destination output port. The channel emulator system may further include a time to frequency to time domain converter associated with the fading channels. The time to frequency to time domain converter may include Fourier Transform logic for converting the time domain IQ samples to frequency domain and Inverse Fourier Transform logic for converting frequency domain IQ samples to time domain. The Fourier Transform logic may include FFT logic and the Inverse Fourier Transform logic may include IFFT logic. The PC computing platform may include a GPPP and the time to frequency to time domain converter may be implemented in the GPPP. The user interface and controller may generate time domain representations of tap coefficients from channel model specification and convert them to frequency domain coefficients. The user interface and controller may configure the switch logic to set topology configuration.

This invention also features a method of MIMO/OTA channel emulation in a PC computing platform including at least one GPPP including defining a plurality of fading channels in a GPPP, generating complex tap coefficients in a GPPP for the fading channels, and emulating 3-dimensional over-the-air field at the DUT by coupling a plurality of fading channels into the elements of antenna systems surrounding the DUT.

In a preferred embodiment the method of channel emulation may further include configuring switch logic in a GPPP for setting topology configuration. Setting topology configuration may include routing IQ samples from channel emulator input ports to fading channels and from fading channels to channel emulator output ports. The method of channel emulation may further include packetizing IQ samples from each input port. Packetizing may include grouping a data stream of IQ samples into packets and applying a source address, a destination address, and a time stamp to each packet of IQ samples. The packets may be routed according to the source and destination addresses to the designated fading channels. Packets from the fading channels may be reconfigured by an addresser implemented in a GPPP with the source address of the fading channel and the destination address of at least one designated output port according to topology configuration. The packets may be routed by switch fabric implemented in a GPPP in accordance with the source and destination addresses. The method of channel emulation may further include depacketizing IQ samples associated with each output port. Depacketizing may include extracting the IQ samples from each packet, summing them in accordance with the time stamp and reassembling the summed IQ samples for delivery to the addressed output port. The method of channel emulation may further include configuring the complex tap coefficients in the GPPP to implement a channel model. Configuring the complex tap coefficients may include applying them to a tapped delay line. The method of channel emulation may further include converting time domain IQ samples from input ports to frequency domain and providing them to the fading channels and recognizing frequency domain IQ samples from fading channels, summing the IQ samples from multiple fading channels bound for the same output port and having the same time stamp, converting each sum of IQ samples to frequency domain and providing frequency domain IQ samples to emulator output ports. Converting time domain IQ samples to frequency domain and converting frequency domain to time domain may include performing Fourier transforms and inverse Fourier transforms, respectively. The method of channel emulation may further include programming, through a user interface and controller implemented in a CPU in a PC computing platform, configuring the complex tap coefficients to implement a selected channel model and configuring of the switch logic for constructing a selected topology configuration.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
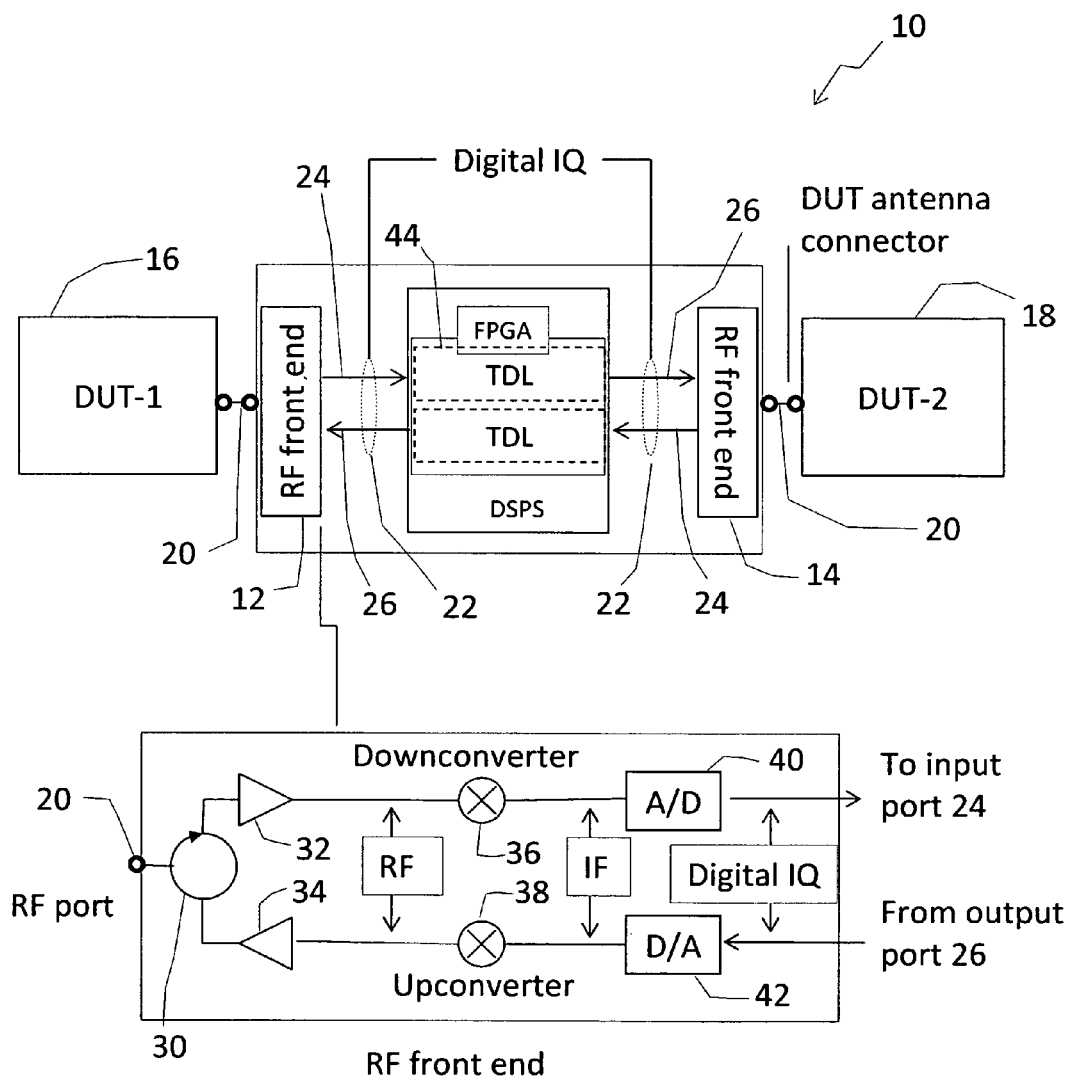
FIG. 1 is a schematic block diagram of a prior art channel emulator with an exploded detail of an RF front end.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

A preferred embodiment of the invention reduces the cost of multiport channel emulators by an order of magnitude in two important ways: it reduces the number of expensive fading channel subsystems by employing switch logic and it reduces the cost of each fading channel subsystem by enabling the channel emulation algorithms to be implementable on inexpensive commercial hardware (e.g. a personal computer platform with a GPU graphics card) instead of requiring expensive FPGAs. The invention typically partitions functions among GPU and CPU cores in the system. Further it enables approaches not used in FPGA-based channel emulator architectures but that are ideally suited to be performed on a highly parallel GPU architecture.

Given that commercial investments in CPU and GPU technology dwarf investments in FPGA technology, it is expected that the benefits of this architecture will increase over time. CPUs and GPUs are multi-core parallel computing devices commonly used in today's personal computing (PC) platforms. As parallel computing technology evolves, the names CPU and GPU may be replaced by other terminology. The essence of this invention to make use of general purpose parallel processors (GPPP), such as GPUs and their successors, to enable channel emulation algorithms that reduce cost and enhance channel emulation functionality of channel emulation systems.

Through the use of common switch fabric (e.g. Ethernet, InfiniBand or proprietary) this invention introduces an architecture whereby fading channel subsystems can be dynamically switched in and out of the emulator topology instead of being statically allocated in a full mesh configuration. Such use of switch fabric significantly reduces the number of required fading channel subsystems for a variety of useful test configurations.

A full mesh topology of the emulator requires N times M fading-channel-based paths. The number of paths grows exponentially with the number of channel emulator ports. Use of switch fabric, according to this invention, enables easy programming of the particular topology, which can reduce the scaling of the fading channel hardware vs. the number of emulator ports from exponential to linear with M and N (e.g., aM+bN where a and b are small) while still accommodating a majority of realistic test cases.

In certain test topologies, many nodes don't need to be interconnected, as for example in the case of one 4×4 MIMO base station communicating with a multitude of SISO handsets. The handsets only communicate through the base station and not directly to one another thus making a full-mesh topology unnecessary.

The switch fabric approach, according to this invention, allows flexible emulator topology through simple software reconfiguration. A 16-port channel emulator can interconnect e.g.: two 8×8 MIMO stations; one 4×4 MIMO base station in a network with six 2×2 MIMO stations; four 2×2 MIMO stations roaming between two 4×4 MIMO base stations; three 2×2 base stations with 10 SISO stations roaming among them; sixteen SISO stations in a mesh.

Figure 5:
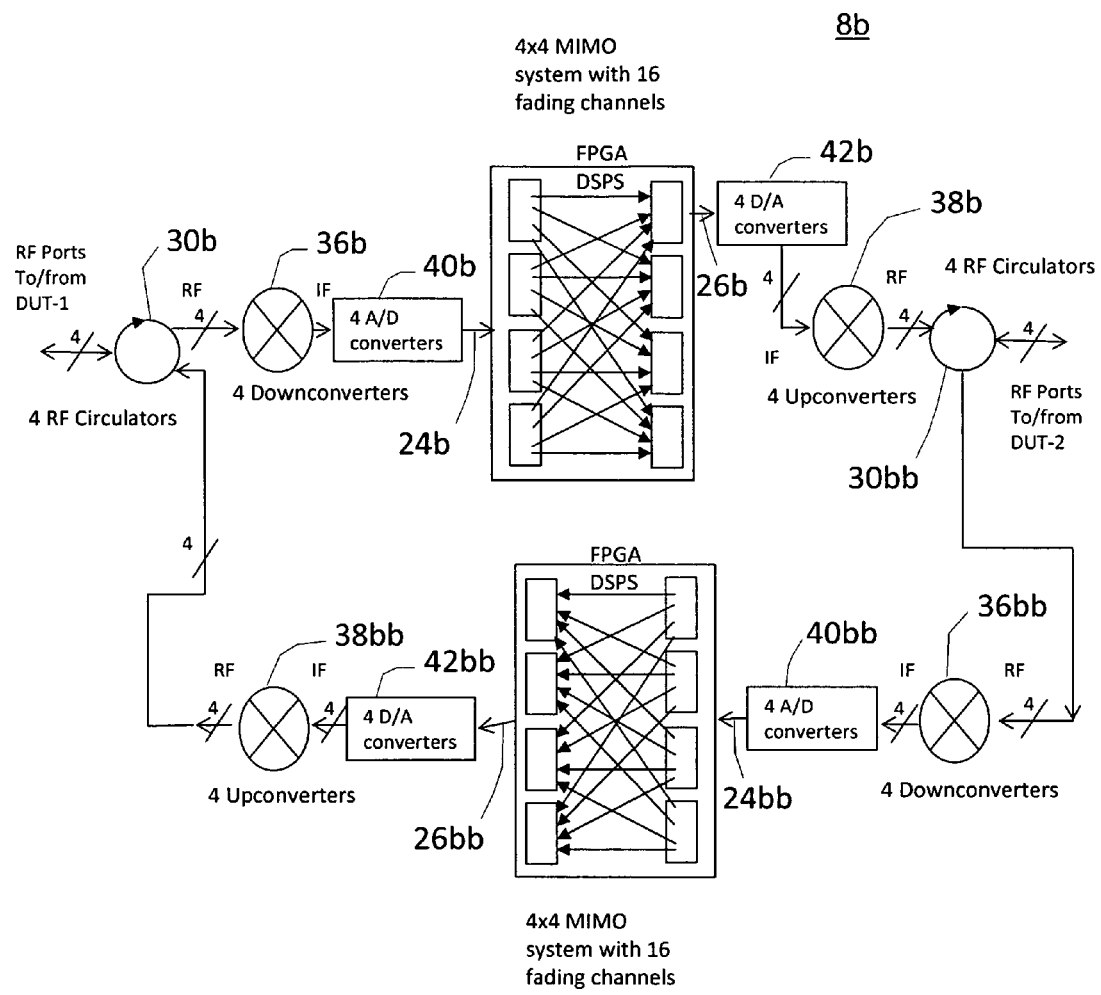
FIG. 5 is a schematic block diagram of a prior art 4×4 MIMO channel emulator with duplicated FPGA based DSPS and RF subsystems to emulate forward and reverse signal propagation.
Figure 6:
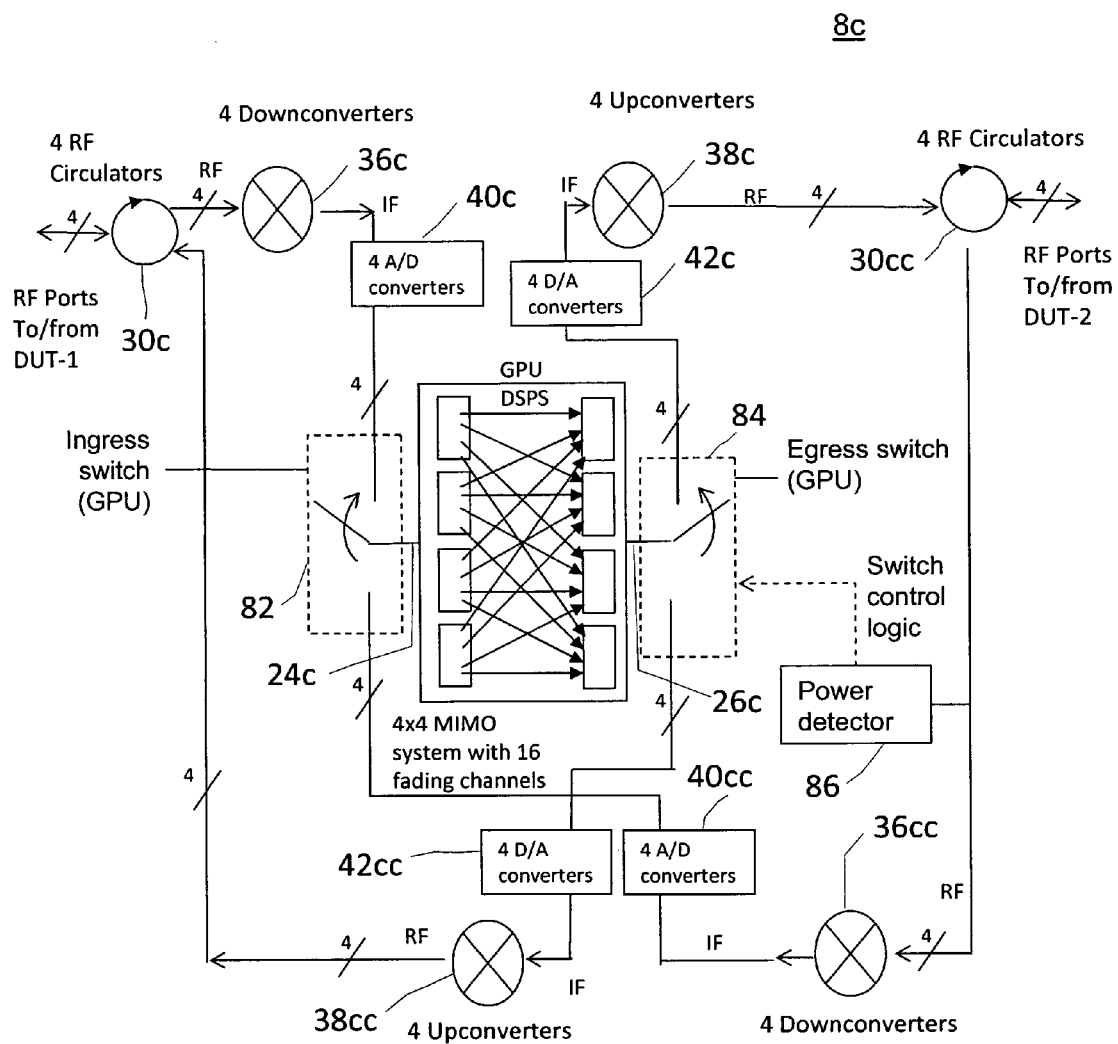
FIG. 6 is a schematic block diagram of a channel emulator system and method according to one embodiment of this invention using switch logic and GPU (graphics processing unit) implemented.

One common use of switch fabric in a channel emulator can be cost-reduction of bidirectional half-duplex links. A prior art channel emulator implements the forward and reverse paths between two DUTs by replicating hardware, as shown in FIG. 5. For half-duplex systems, such as IEEE 802.11 based systems, where only one DUT transmits at a time, switch fabric enables re-use of the fading channels for both forward and reverse directions by dynamically switching the flow of IQ streams to and from the DUTs through one DSPS, which can be implemented e.g. on a GPU, as shown in FIG. 6, instead of using prior art FPGA approach.

Switch fabric also allows implementations whereby fading channel subsystems that execute faster than real-time can be time-shared and used to emulate multiple paths. For example, if a fading channel subsystem were executing at 10× real-time, the channel emulator could reuse this subsystem 10 times, reducing by an order of magnitude the amount of required computational hardware.

The use of switch fabric can enable emulation of a wireless network whereby a fixed number of fading channels is dynamically allocated to selected paths according to a specific policy. For example, dedicating expensive fading channel subsystems to paths with significant signal attenuation may be of marginal usefulness. So, if only a fixed number of fading channel subsystems is available, these subsystems can be dynamically assigned to paths with the strongest signals and the other paths delivering low signal power can be assigned some fixed attenuation requiring no hardware for implementing time-variable fading.

Switch fabric technology is commonly employed in Ethernet, Fibre Channel and InfiniBand switches. Low cost Ethernet switches, designed to transport mostly transmission control protocol (TCP) or user datagram protocol (UDP) internet protocol (IP) traffic, typically exhibit latencies in milliseconds, which may be too high for delay-sensitive channel emulation. However, InfiniBand technology optimized for high-performance computing (HPC) environments and used to interconnect CPU/GPU clusters, exhibits low latencies (as low as 0.3 microseconds today). Alternatively switch fabric logic can be implemented as software running on one or more GPU cores, thereby requiring no additional hardware in the channel emulator. Switch fabric and commercial CPU/GPU technologies are on the downward pricing path due to standardization and high volume production. Thus, novel uses of these technologies can significantly improve the scalability and cost-effectiveness of channel emulators.

Conventionally, received signals subject to multipath can be modeled as a series of attenuated, time-delayed, phase-shifted replicas of the transmitted signal using the expression:

$$h_b(t, \tau) = \sum_{i=0}^{N-1} a_i(t, \tau)\exp[j(2\pi f_c \tau_i(t) + \phi_i(t, \tau))]\delta(\tau - \tau_i(t)) \quad (1)$$

where $\alpha_i(t, \tau)$, $\tau_i(t)$ and $2\pi f_c \tau_i(t)+\phi_i(t, \tau)$ represent the real amplitude, delay, and phase shift of the $i^{th}$ multipath component at time t, N is the total number of multipath taps and $\delta(\bullet)$ is the unit impulse function. A common method to replicate the channel impulse response (CIR) in a channel emulator is the use of filtered noise to generate random processes for $\alpha_i(t, \tau)$ and a tapped delay line (TDL) to provide the sum across multipath constituents. The number of taps then necessary to capture all or most of the signal energy depends on the delay spread.

Figure 2:
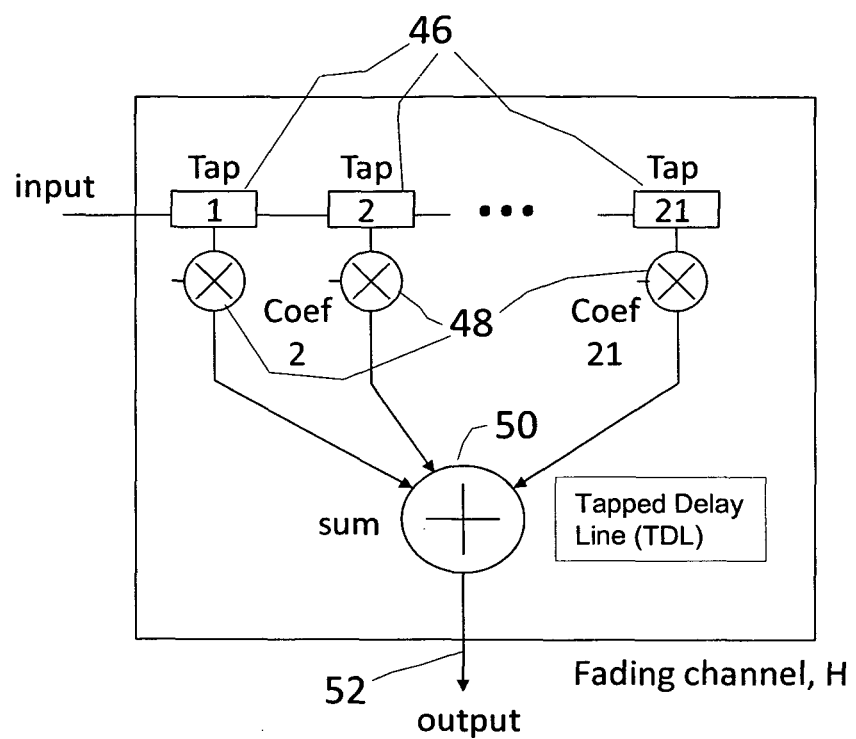
FIG. 2 is a schematic block diagram of a prior art FPGA implemented tapped delay line (TDL) fading channel.

There is shown in FIG. 1 a conventional bidirectional channel emulator arrangement including DSPS (DSP subsystem) 10 with RF front ends 12 and 14 servicing the devices under test, (DUTs) DUT-1 16 and DUT-2 18. DUT-1 16 connects to DSP subsystem 10 either via its RF antenna connector 20 through the RF front end 12 or directly into the digital IQ bus 22 of DSP subsystem 10. A stream of IQ samples from the RF receiver in the RF front end arrives at the input port 24 of DSPS 10. A stream of IQ samples to the RF transmitter in the RF front end 14 arrives via output port 26. A typical RF front end 12, 14 shown exploded in FIG. 1 may include a circulator 30 with low noise amplifier (LNA) 32 and power amplifier (PA) 34 and downconverter 36 and upconverter 38 mixers where the RF/IF transformations are accomplished. An analog to digital converter 40 converts the analog IF signal to digital for delivery to input port 24. Digital to analog converter 42 converts the digital signal from output port 26 to analog for delivery to upconverter mixer 38. Typically DSPS 10 includes one or more tapped delay lines (TDLs) 44 implemented using FPGAs. A typical tap delay line (TDL), FIG. 2, 44 includes a plurality of taps 46 each of which has associated with it a multiplier 48 for applying time varying coefficients, the products of which are combined in summer 50 to provide the TDL output 52. The multipliers 48 are complex multipliers operating on complex IQ data and complex time variable coefficients.

Figure 3:
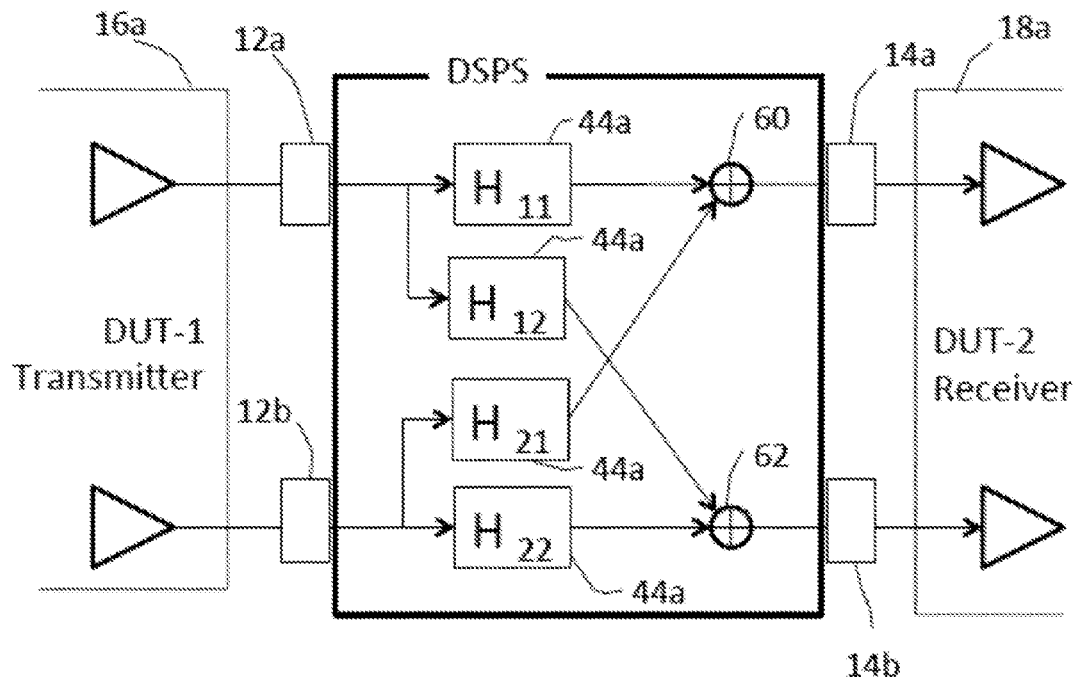
FIG. 3 is a schematic block diagram of a prior art unidirectional 2×2 MIMO channel emulator with four fading channels.

A typical 2×2 multiple input multiple output (MIMO) channel emulator DSPS 10a, FIG. 3, includes four TDLs 44a implementing four correlated fading channels. Each fading channel TDL 44a is modeled using tapped delay lines $H_{11}$, $H_{12}$, $H_{21}$, $H_{22}$, with time varying and spatially correlated coefficients. The outputs of fading channels $H_{11}$, and $H_{21}$ are combined in summer 60 and the outputs of fading channel 44a TDLs $H_{12}$, and $H_{22}$ are combined in summer 62.

Figure 4:
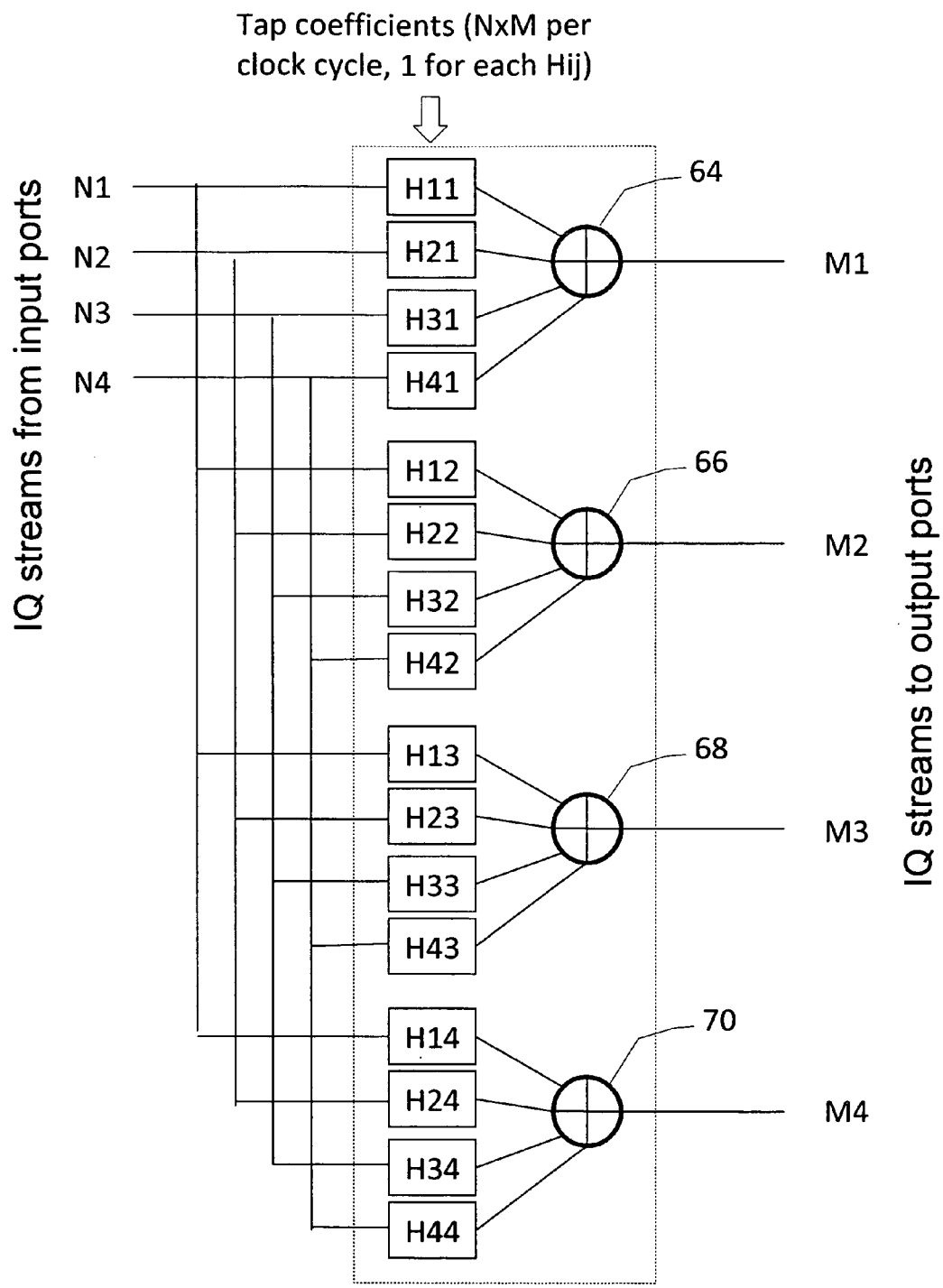
FIG. 4 is a schematic block diagram of a prior art digital signal processing subsystem (DSPS) of a 4×4 MIMO channel emulator with sixteen fading channels.

A 4×4 MIMO channel emulator DSPS 10b with sixteen correlated fading channels is shown in FIG. 4 with four input MIMO streams of IQ samples at N1-N4 distributed to sixteen fading channels, TDLs 44b, designated: $H_{11}$, $H_{21}$, $H_{31}$, $H_{41}$ which are combined in summer 64; $H_{12}$, $H_{22}$, $H_{32}$, $H_{42}$, combined in summer 66; $H_{13}$, $H_{23}$, $H_{33}$, $H_{43}$, combined in summer 68; and $H_{14}$, $H_{24}$, $H_{34}$, $H_{44}$, combined in summer 70 to provide four output MIMO streams of IQ samples M1-M4.

A prior art implementation of a typical 4×4 MIMO channel emulator system 8b, FIG. 5, duplicates the DSPS and RF subsystems to emulate forward and reverse signal propagation. Thus there are two channel emulator DSPS 10b, 10bb to implement the 4×4 MIMO paths with sixteen fading channels in each direction. DSPS 10b has associated with it four D/A converters 42b, four upconverters 38b, four A/D converters 40b, four downconverters 36b. Likewise DSPS 10bb has associated with it four upconverters 38bb, four A/D converters 40bb, four D/A converters 42bb and four downconverters 36bb. There are four RF circulators each 30b and 30bb which are shared by both DSPS 10b and 10bb.

In accordance with this invention half duplex channel emulation can be effected using switch fabric logic immediately requiring only half the computing hardware: one DSPS instead of two, FIG. 6. Instead of duplicating the computing hardware in the forward and reverse directions, switch fabric logic 80 including ingress switch logic 82 and egress switch logic 84 is used to enable a single DSPS 10c to operate in both the forward and reverse directions. Also according to this invention the DSPS 10c is no longer implemented using expensive FPGA hardware but rather using GPU software to perform the required functions. Similarly the switch logic 80 including ingress switch logic 82 and egress switch logic 84 is also implemented using GPU software. The direction of operation can be discerned very simply using, for example, power detector 86. When the power at RF port from DUT-2 is low, indicating that DUT-2 is not transmitting, the flow of IQ samples is from A/D converters 40c to D/A converters 42c, directing the transmit signal from DUT-1 to DUT-2. When power detector 86 senses the transmit signal from DUT-2, operation is in the reverse direction from A/D converters 40cc to D/A converters 42cc thus reversing the flow of IQ samples from the transmitting DUT-2 to the receiving DUT-1.

Figure 7:
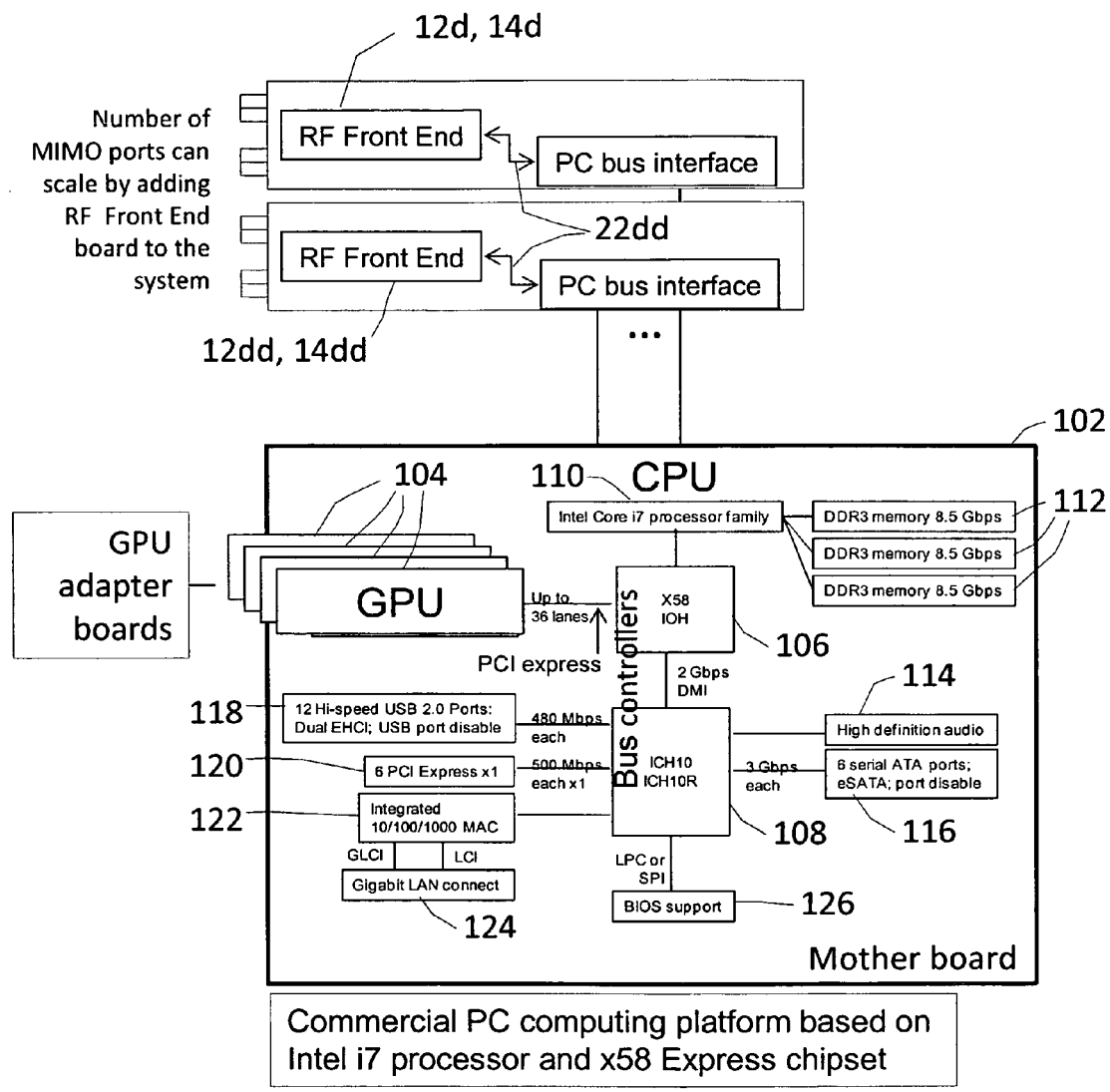
FIG. 7 is a schematic block diagram of a channel emulator system and method according to one embodiment of this invention using GPU(s) and CPU(s) (central processing unit) in a conventional PC computing platform.

One embodiment of the novel channel emulator architecture of this invention using a consumer-grade PC computing platform to implement the channel emulator and also run the interface and controller is shown in FIG. 7. The suggested hardware incorporates low-cost, computationally efficient, easy to program off-the-shelf CPUs (e.g., Intel Core i7 processor) and GPUs (e.g., NVIDIA GeForce) to perform much of the signal processing functionality previously performed on more costly and bulky FPGAs. The number of emulator ports can be scaled by adding RF front end boards 90 to the system which then supplies streams of IQ samples to the channel emulator system via the PC bus, e.g. PCI express bus. The channel emulator system is implemented on a mass produced PC platform 100 based, for example, on Intel i7 processor with x58 Express chipset on mother board 102 which replaces FPGA computing logic greatly reducing the cost. A number of massively parallel GPU boards, for example, four 104, can be connected via PCI express (PCIe) bus managed by the Intel x58 IOH device 106. CPU 110 may be provided using Intel core i7 associated with memory 112. PC platform 100 may include other conventional components such as high definition audio 114, serial ATA ports 116, high speed USB ports 118, PCI express elements 120, 10/100/1000 Base-T Ethernet Medium Access Control (MAC) 122 and physical layer (PHY) Gigabit LAN connect 124 and BIOS support 126, for example.

Figure 8:
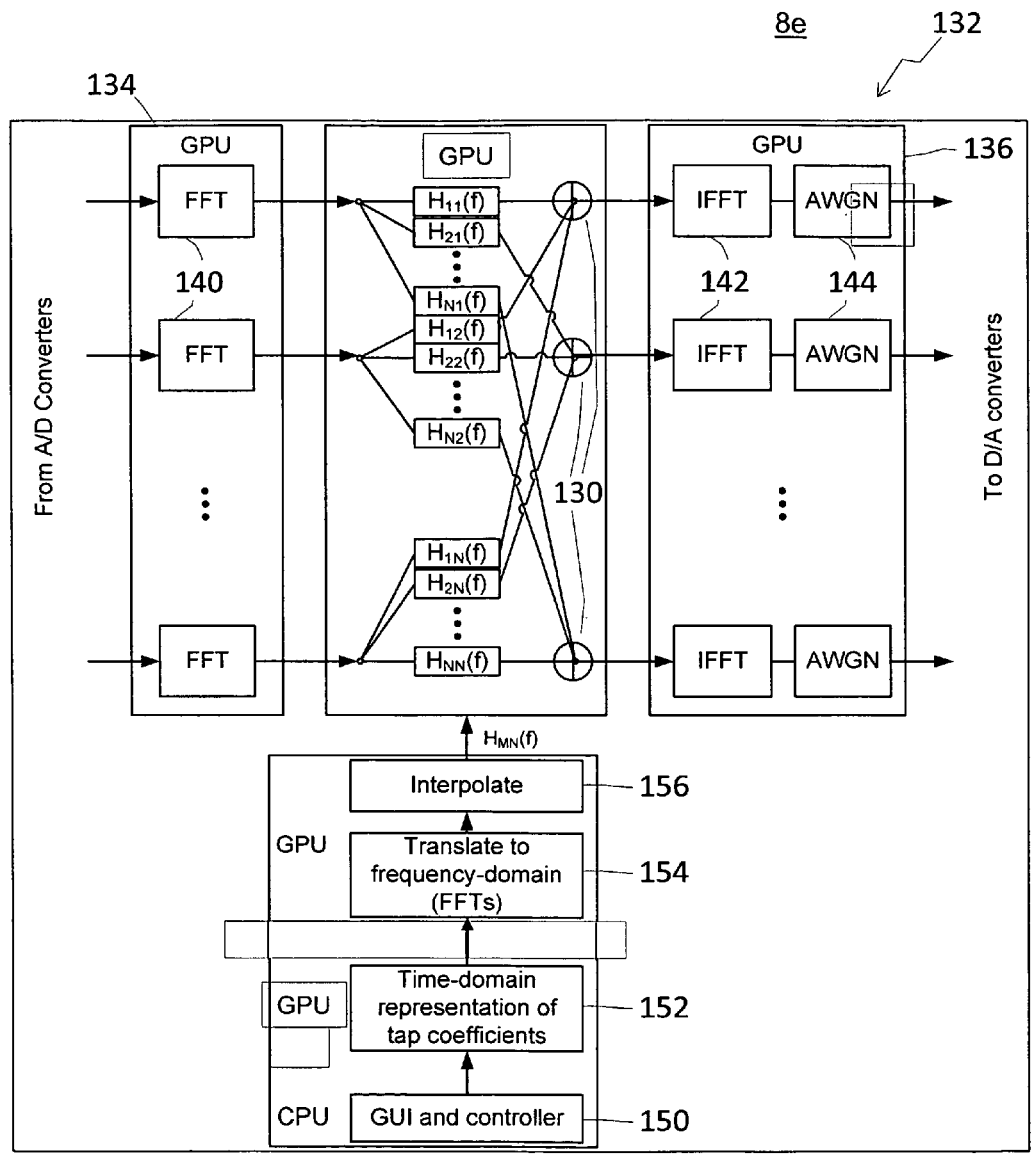
FIG. 8 is a schematic block diagram of a channel emulator system and method according to one embodiment of the invention illustrating multiple GPUs executing selected portions of the emulation and with frequency domain instead of time domain implementation.

In one embodiment of the invention multiple GPU cores execute different portions of the channel emulation. Further, computations that are implemented in the time domain as with tapped delay lines and multipliers may be implemented in the frequency domain to achieve higher computational efficiency when executed on a GPU as shown in FIG. 8 where DSPS 10e has the fading channels 44e and their associated summers 130 implemented using GPU software. The multi-stage architecture of Fast Fourier Transforms (FFTs) and Inverse FFTs (IFFT) leads to efficient parallelization and implementation on GPUs. FFTs, IFFTs, and block-multipliers can be used in lieu of traditional tapped delay lines to greatly reduce the overall number of fading channel computations (e.g., multiplications, additions), especially for a large number of fading channels interconnecting input and output antennas. Also implemented with GPU software is the time domain to frequency domain to time domain converter 132 which includes time domain to frequency domain converter 134 and frequency domain to time domain converter 136. In one implementation time to frequency to time converter 132 may apply Fourier transforms which may, for example, be Fast Fourier Transforms FFT 140 and the frequency to time converter 136 may apply Inverse Fourier Transforms such as Inverse Fast Fourier Transforms 142. Additive white Gaussian Noise (AWGN) circuits 144 in converter 136 may also, optionally, be implemented using GPU software. AWGN is sometimes added to emulate noise in the wireless channel. The CPU may be used to implement a graphical user interface (GUI) and controller 150 while a GPU core may be used to implement the time domain representation of the tap coefficients 152. Still another GPU core may be used to implement the translation to frequency domain 154 of the coefficients and to perform the necessary interpolation 156. When generated in the time domain 152 coefficients are sampled at kHz rates while at the fading channels, the coefficients are sampled at the same rate as IQ samples, at MHz rate, generally. Interpolation 156 includes sample rate conversion that synchronizes the sample rate of the coefficients with the sample rate of the IQ samples.

Figure 9:
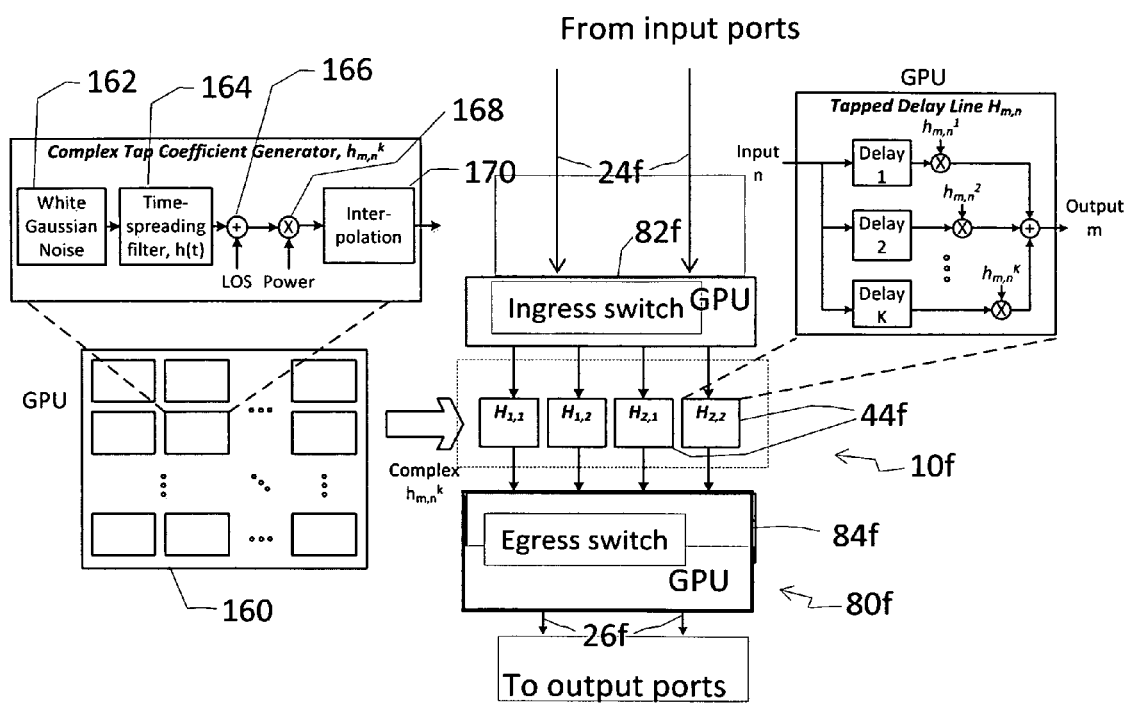
FIG. 9 is a schematic block diagram of a channel emulator system and method according to an embodiment of the invention using switch fabric logic with ingress and egress switch logic using GPU implementation.

In accordance with one embodiment of the invention, switch logic 80f of FIG. 9, including ingress switch logic 82f and egress switch logic 84f are placed at the input 24f and output ports 26f of DSP subsystem 10f. Ingress switch logic 82f routes IQ streams from each input port to a selected fading channel 44f, $H_{ij}$; egress switch logic 84f routes IQ streams from the output of each fading channel 44f to the selected output port 26f. In FIG. 9 there is shown the traditional time domain based implementation of fading channels using tapped delayed lines (TDLs) which are implemented using software running in parallel on one or more GPU cores as are the ingress and egress switch logic 82f and 84f. Also implemented using GPU software in accordance with the invention is the generation of the complex tap coefficients. A complex tap coefficient generator 160 is implemented on one or more cores of a GPU to generate the coefficients used by the fading channels 44f, $H_{ij}$. Typically the generator 160 applies white Gaussian noise 162 to a time spreading filter 164 the output of which is combined in summer 166 with the line of sight (LOS) input multiplied in multiplier 168 by the power and delivered to the output after interpolation 170.

Figure 9A:
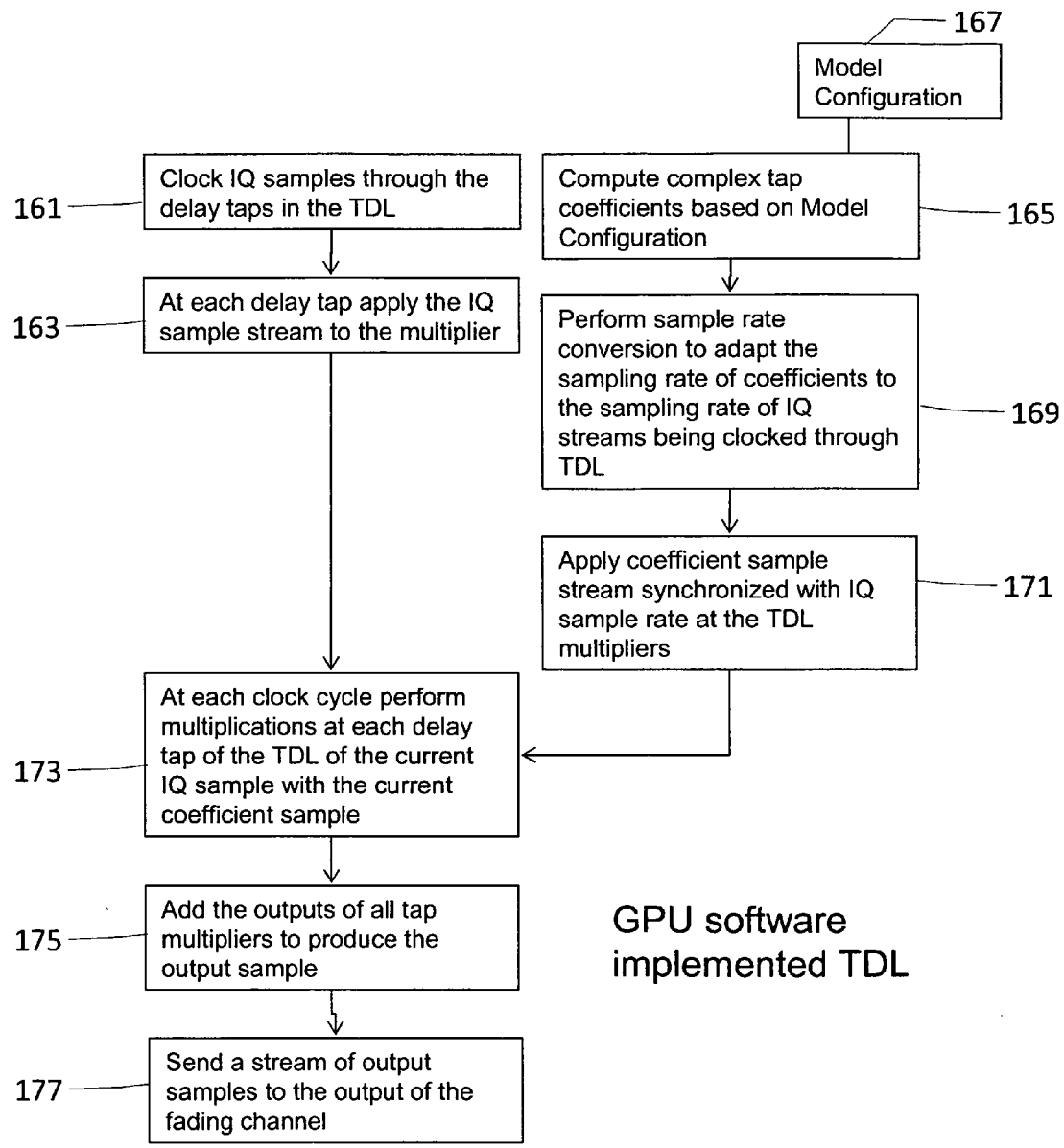
FIG. 9A is a diagram of the TDLs of FIG. 9 implemented with software running on a parallel processing device such as a GPU according to this invention.

There is shown in FIG. 9A a diagram of a TDL of FIG. 9 implemented in software according to this invention. IQ samples are clocked through the delay taps in the TDL 161. At each delay tap the IQ sample stream is applied to the multiplier 163. Complex tap coefficients are computed based on model configuration 165 obtained from model configuration source 167. Sample rate conversion is performed to adapt the sampling rate of coefficients to the sampling rate of IQ streams being clocked through the TDL 169. The coefficient sample stream synchronized with IQ sample rate is applied at the TDL multipliers 171. At each clock cycle multiplications of the current IQ sample from 163 with the current coefficient sample 171 are performed at each delay tap of the TDL 173. The outputs of all tap multipliers are added to produce the output samples 175. A stream of output samples is sent to the output of the fading channel 177.

Figure 10:
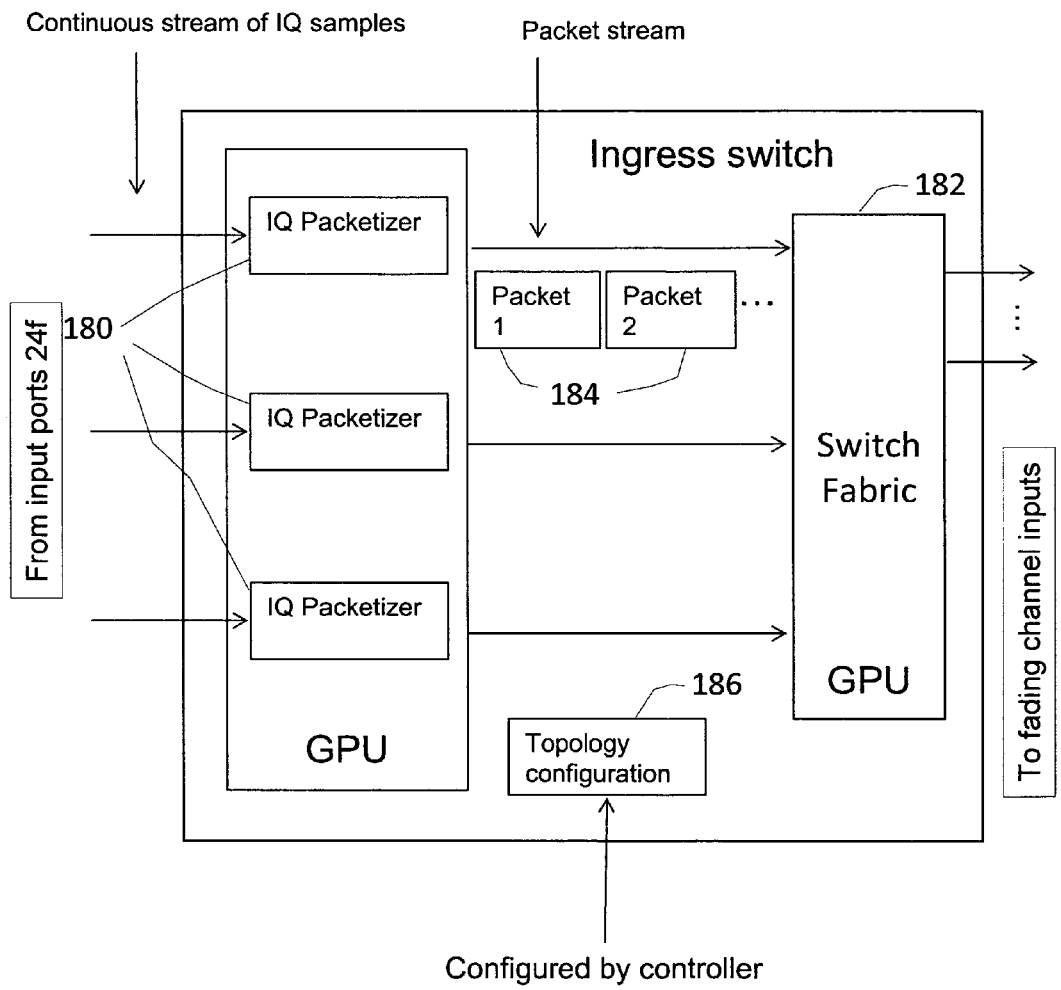
FIG. 10 is a schematic block diagram of the ingress switch logic of FIG. 9 implemented using GPU(s) according to one embodiment of this invention.

Ingress switch logic 82f, FIG. 10, may include a number of IQ packetizers 180 as well as the switch fabric logic 182. The switch fabric logic 182 and each packetizer 180 is implemented in the GPU. One packetizer is instantiated for each input port of the channel emulator. Each IQ packetizer 180 groups the IQ samples into packets 184. Each packet is assigned by IQ packetizer 180 source address corresponding to the input port for which the packetizer is instantiated, destination address corresponding to the destination fading channel according to topology configuration, and a time stamp. The source and destination address fields are used by the ingress switch fabric logic 182 to route the packets to the designated fading channels. The particular channel emulator topology configuration 186 is programmed through the controller 150, FIG. 8. The packetizer may create one or more packets with the same group of IQ samples and the same time stamp but with one or more different fading channel destination addresses. For the use cases when the fading channel computation runs faster than real-time and the fading channel computing resources are used to compute multiple fading channels for a particular topology, the same time stamp may be assigned to multiple packets with different source and destination addresses.

Figure 11:
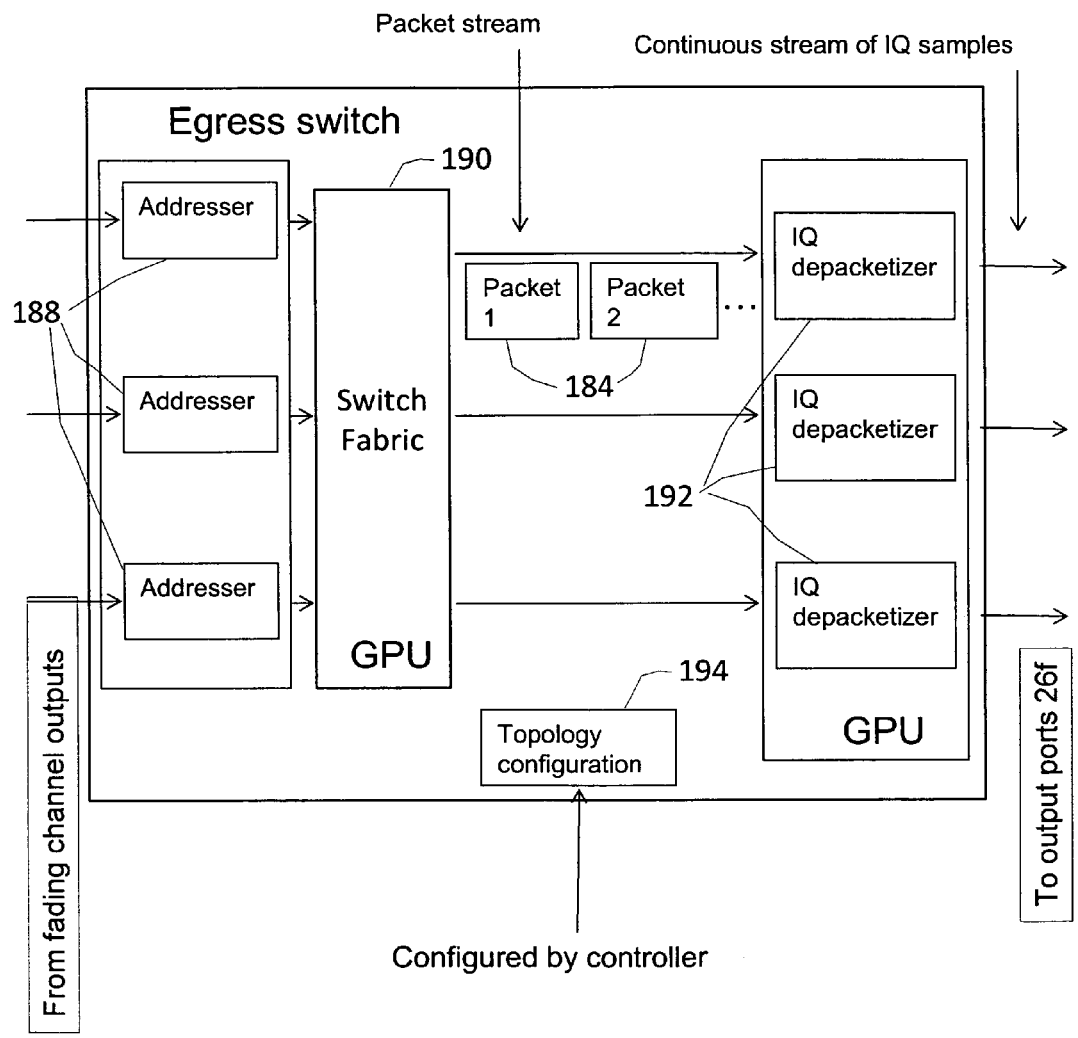
FIG. 11 is a schematic block diagram of the egress switch logic of FIG. 9 implemented using GPU(s) according to one embodiment of this invention.

Egress switch 84f, FIG. 11 includes addressers 188, switch fabric logic 190 and IQ depacketizers 192. Addressers 188 replace the source address and destination address fields in each packet with the source address of the fading channel for which they are instantiated and the destination address of the target channel emulator output port based on topology configuration 194. Here too topology configuration 194 is controlled by interface and controller 150, FIG. 8. If fading channel hardware runs faster than real-time and is re-used to compute multiple fading channels, each fading channel may generate IQ streams bound for one or more output ports. In this case, addressers 188 may generate multiple packets with the same time stamp, one packet for each output port and each such packet having the destination address of the designated output port. Each addresser 188 is implemented as GPU software and is instantiated for each fading channel. Each IQ depacketizer 192 is implemented as GPU software, as is switch fabric logic 190. One depacketizer 192 is instantiated for each output port of the channel emulator. Egress switch fabric logic 190 directs packets 184 to each depacketizer based on the destination address of the emulator output port for which the depacketizer 192 is instantiated. Depacketizer 192 extracts the IQ samples from each packet 184, lines them up in time with the IQ samples having the same time stamp and extracted from packets arriving from other fading channels (i.e., having different source addresses). The IQ samples thus extracted from packets by IQ depacketizer are formed into one or more IQ streams, which in prior art implementations typically enter summers at each output port, as shown in FIG. 4, for example. IQ depacketizer 192 then mathematically adds multiple IQ streams, as in prior art implementations, and directs the stream resulting from such summation to the channel emulator output port for which it is instantiated.

Figure 12:
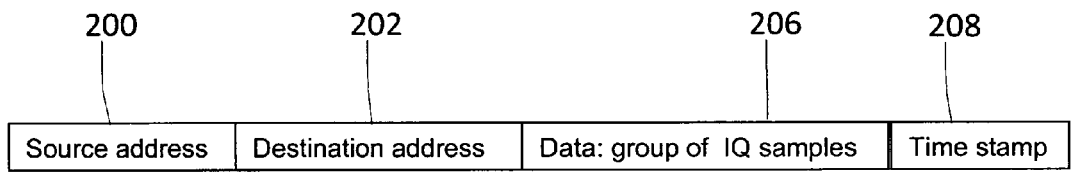
FIG. 12 is a diagram of a packet structure.

The packet structure 184, FIG. 12, may be implemented having a source address 200, destination address 202, IQ samples 206, and time stamp 208.

Figure 13:
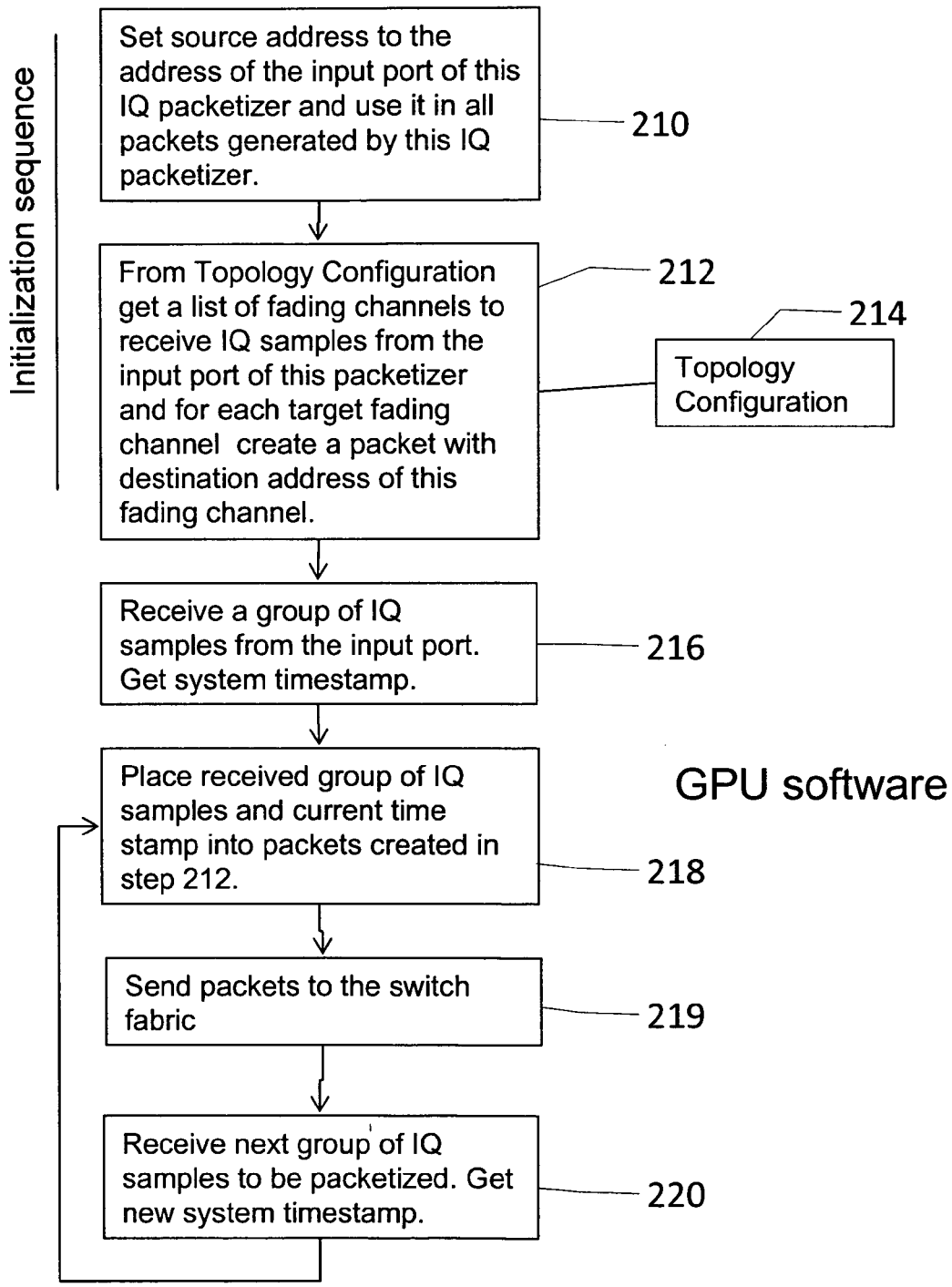
FIG. 13 is a diagram of a packetizer state machine according to an embodiment of this invention.

The IQ packetizer state machine functions as illustrated in FIG. 13. In the initialization sequence the input source address is set 210 to the address of the input port of the IQ packetizer and the IQ packetizer uses this source address in all packets it generates. Also in the initialization sequence a list of the fading channel destination addresses is obtained 212 based on the topology configuration 214. A group of IQ samples is received from the input port 216 and the system time stamp is introduced. A packet is created 218 for each fading channel destination address with the received group of IQ data samples and current time stamp. Then the next group of IQ samples to be packetized is received 220 and gets the new system time stamp. All of this once again is implemented in the GPU.

Figure 14:
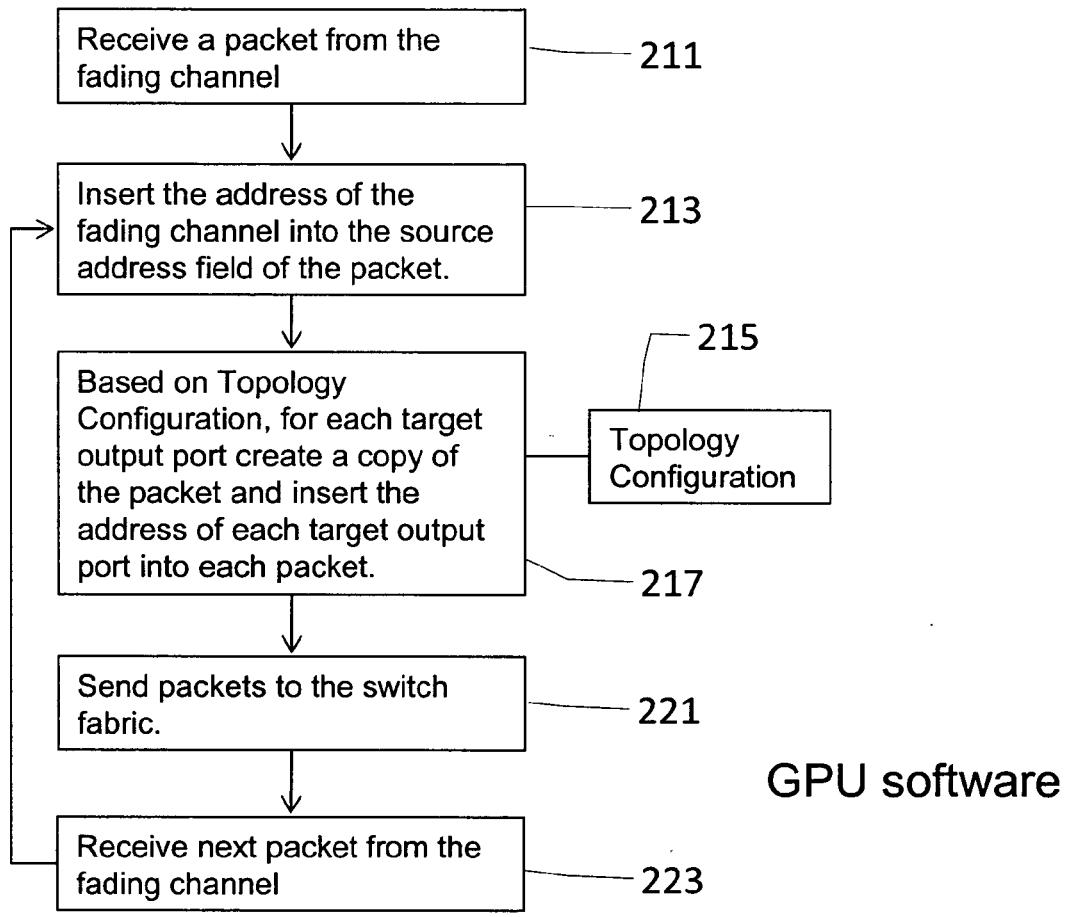
FIG. 14 is a diagram of an addresser state machine according to an embodiment of this invention.

Addressers 188, FIG. 11, operate as shown by the state diagram in FIG. 14, where the addresser receives a packet from the fading channel for which it is instantiated. Then the address of the fading channel is inserted into the source address field of the packet 213. Based on the topology configuration 215 for each designated output port a copy of the packet is created with the destination address of the designated output port 217. The packets are sent to the switch fabric 221 and the addresser receives the next packet from the fading channel 223.

Figure 15:
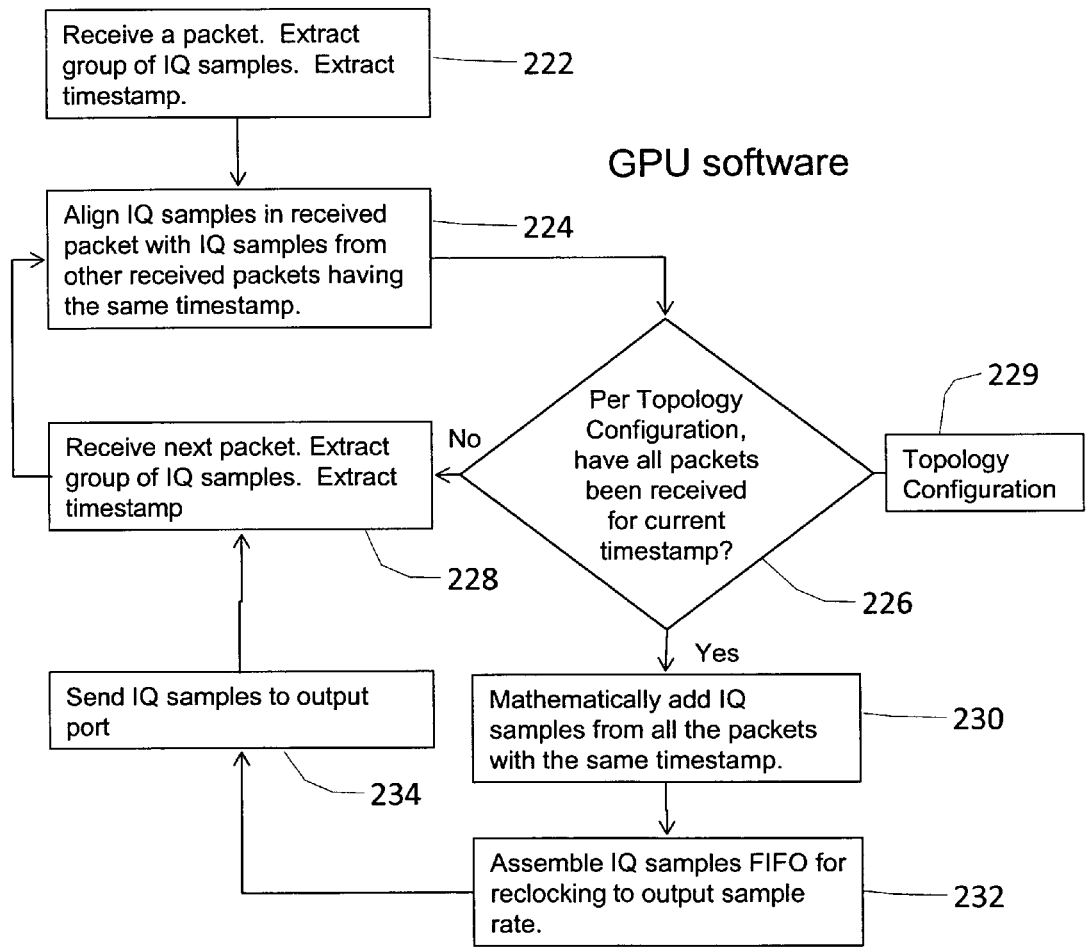
FIG. 15 is a diagram of a depacketizer state machine according to an embodiment of this invention.

The function of the IQ depacketizer state machine is illustrated in FIG. 15. A packet is received and the group of IQ samples and time stamp is extracted 222. The IQ samples in the received packet are aligned with the IQ samples from other received packets having the same time stamp 224. In the next state 226 topology configuration 229 is applied to determine whether all packets have been received for the current time stamp. Topology configuration 229 describes which fading channels direct IQ samples to the output port of the IQ depacketizer and hence indicates how many packets with the same time stamp are expected to arrive and from which fading channels. If not all expected packets with the same time stamp have arrived, in the next state 228 the next packet is received and the group of IQ samples and time stamp are extracted and the system returns to state 224. If all packets have been received for the current time stamp then the IQ samples from all the packets with the same time stamp are mathematically added 230. As in prior art implementations, once the IQ samples are extracted from packets and regrouped into streams, the addition operation of IQ samples 230 consists of adding each IQ sample from each IQ stream on every clock cycle, thus producing an IQ stream, which is the sum of the incoming streams with each IQ sample being a sum of the corresponding samples in the streams being added. In the next state 232 the IQ samples are assembled on a first in first out basis for reclocking to the sample rate of the TDL. Following this the IQ samples are sent to the output port 234.

Figure 16:
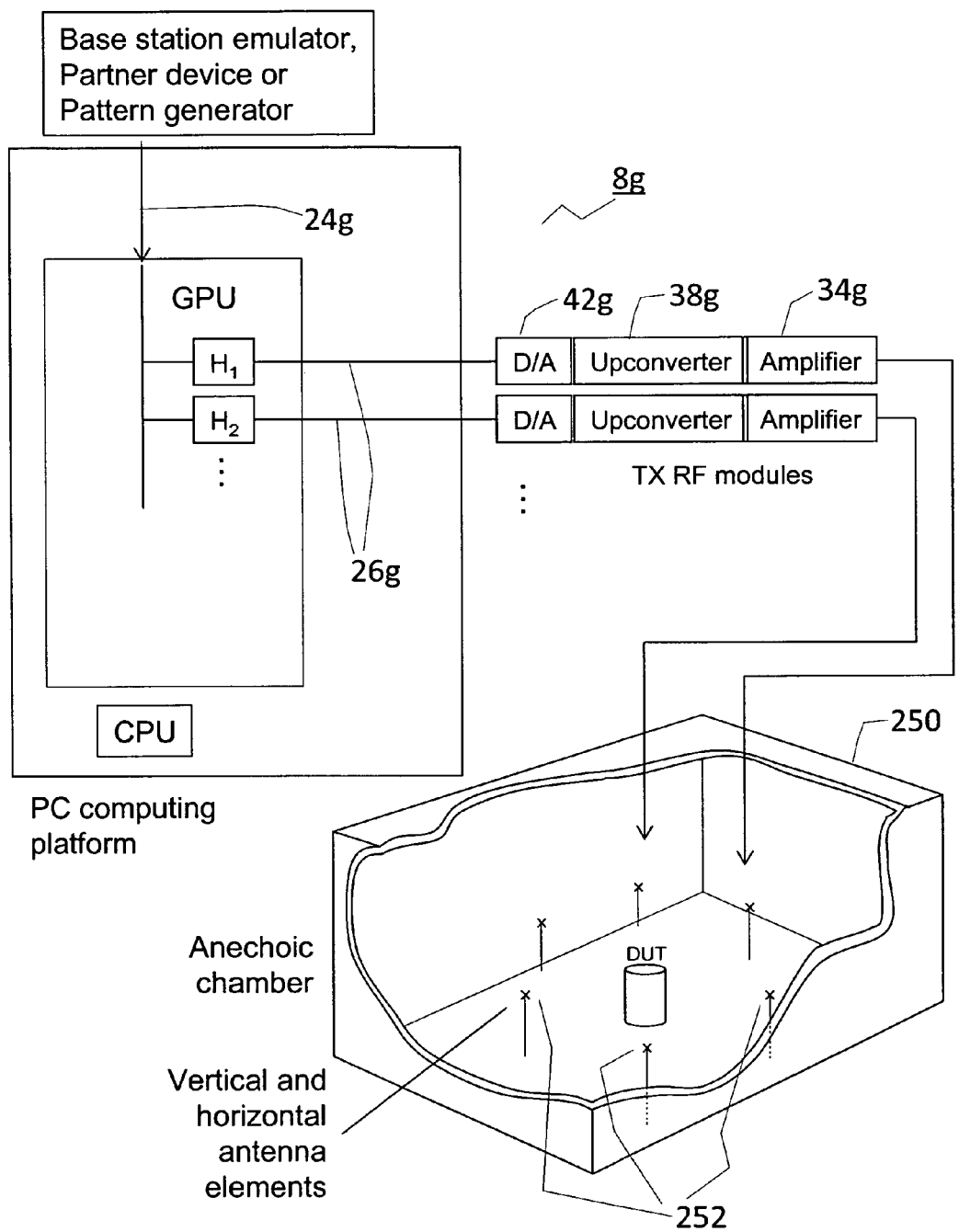
FIG. 16 is a schematic block diagram of a MIMO/OTA (Over the Air) channel emulator topology.

Another important use of switch fabric is to program channel emulator topology for MIMO/OTA (over the air) testing, as shown in FIG. 16. For this test configuration the DUT is placed in an anechoic chamber 250 and surrounded by test antenna systems 252. Each antenna system 252 is then stimulated with signals produced by the channel emulator such that in aggregate, all the test antenna systems 252 surrounding the DUT model a variety of multipath and Doppler fading conditions in 3-dimensional space. Test signals in the form of IQ streams can be sourced, for example, by one or more base station emulators and distributed through a multitude of fading channels, each fading channel connecting the signal source to each antenna element of a test antenna system. A test antenna system can have two or more antenna elements with each element having a different polarization (e.g. one element having vertical and the other having horizontal polarization). Although FIG. 16 shows only a unidirectional test topology with the transmission directed from the channel emulator towards the DUT, bi-directional MIMO/OTA topologies are also envisioned.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A channel emulator system comprising:
a general purpose parallel processor (GPPP) configured to provide:
a plurality of fading channels;
complex tap coefficient generation logic generating tap coefficients for said fading channels;
ingress switch logic for combining IQ samples into data packets and routing said data packets from channel emulator ports to said fading channels; and
egress switch logic for combining IQ samples generated by said fading channels into data packets and for routing said data packets to channel emulator output ports.

2. The channel emulator system of claim 1 in which said GPPP includes a GPU and said ingress switch logic and said egress switch logic are implemented with said GPU.

3. The channel emulator system of claim 1 in which said ingress switch includes an IQ packetizer associated with each said input port.

4. The channel emulator system of claim 3 in which each said packetizer receives a data stream of IQ samples and groups them into packets of IQ samples, and applies a source address, a destination address and time stamp to each packet of IQ samples.

5. The channel emulator of claim 4 in which said packetizer creates one or more packets with the same group of IQ samples and the same time stamp but with one or more different destination addresses, each destination address designating a different fading channel.

6. The channel emulator of claim 4 in which said ingress switch logic further includes switch fabric implemented in a GPU for receiving the packets from the packetizers and routing packets according to said source and destination addresses to the designated fading channels.

7. The channel emulator of claim 2 in which said egress switch logic further includes addressers associated with each fading channel and implemented in a GPU, each said addresser replaces the source address in the packets with the address of the fading channel for which it is instantiated and replaces the destination address with the address of at least one designated output port according to a topology configuration.

8. The channel emulator of claim 7 in which said egress switch logic further includes switch fabric implemented in a GPU for routing packets in accordance with source and destination address.

9. The channel emulator system of claim 8 further including an IQ depacketizer associated with each output port.

10. The channel emulator system of claim 9 in which each said depacketizer extracts said IQ samples from each packet, sums them in accordance with said time stamp and reassembles said summed IQ samples for delivery to the destination output port.

11. A method of channel emulation in a PC computing platform including at least one general purpose parallel processor (GPPP) comprising:
defining a plurality of fading channels in said GPPP;
generating complex tap coefficients in a said GPPP for said fading channels;
combining IQ samples at channel emulator inputs into data packets and routing said packets to fading channels; and
combining IQ samples produced by fading channels into data packets and routing said data packets to channel emulator outputs.

12. The method of channel emulation of claim 11 further including configuring switch logic in a said GPPP for setting a topology configuration.

13. The method of channel emulation of claim 12 in which setting topology configuration includes routing IQ samples from channel emulator input ports to fading channels and from fading channels to channel emulator output ports.

14. The method of channel emulation of claim 13 further including packetizing IQ samples from each input port.

15. The method of channel emulation of claim 14 in which packetizing includes grouping a data stream of IQ samples into packets and applying a source address, a destination address, and a time stamp to each packet of IQ samples.

16. The method of channel emulation of claim 15 in which said packets are routed according to said source and destination addresses to the designated fading channels.

17. The method of channel emulation of claim 16 in which packets from the fading channels are reconfigured by an addresser implemented in a GPU with the source address of the fading channel and the destination address of at least one designated output port according to a topology configuration.

18. The method of channel emulation of claim 17 in which said packets are routed by switch fabric implemented in a GPU in accordance with said source and destination addresses.

19. The method of channel emulation of claim 18 further including depacketizing IQ samples associated with each output port.

20. The method of channel emulation of claim 19 in which depacketizing includes extracting said IQ samples from each packet, summing them in accordance with the time stamp and reassembling the summed IQ samples for delivery to the addresses output port.

21. The method of channel emulation of claim 15 further including converting time domain IQ samples from input ports to frequency domain and providing them to said fading channels and recognizing frequency domain IQ samples from fading channels, summing the IQ samples from multiple fading channels bound for the same output port and having the same time stamp, converting each sum of IQ samples to time domain and providing time domain IQ samples to emulator output ports.

22. The method of channel emulation of claim 21 in which converting time domain IQ samples to frequency domain and converting frequency domain to time domain includes performing Fourier transforms and inverse Fourier transforms, respectively.

23. A MIMO/OTA channel emulator system comprising a general purpose parallel processor (GPPP) configured to provide: a plurality of fading channels without the use of FPGA;
and complex tap coefficient generation logic generating tap coefficients for said fading channels without the use of FPGA;
a plurality of antenna elements each said antenna element interconnected with one or more of said fading channels; and
further including switch logic for combining IQ samples from channel emulator input ports into data packets and routing said packets to said fading channels and from said fading channels to channel emulator output ports.

24. The channel emulator system of claim 23 in which said GPPP includes a GPU and said GPU is configured to provide said plurality of fading channels and said complex tap coefficient generation logic.

25. The channel emulator system of claim 23 in which said switch logic includes ingress switch logic for routing IQ samples from said input ports to said fading channels and egress switch logic for routing IQ samples from said fading channels to said output ports.

26. The channel emulator system of claim 23 in which said GPPP includes a GPU and said switch logic is implemented with said GPU.

27. The channel emulator system of claim 25 in which said ingress switch includes and IQ packetizer associated with each said input port.

28. The channel emulator system of claim 27 in which each said packetizer receives a data stream of IQ samples and groups them into packets of IQ samples, and applies a source address, a destination address and time stamp to each packet of IQ samples.

29. The channel emulator of claim 28 in which said packetizer creates one or more packets with the same group of IQ samples and the same time stamp but with one or more different destination addresses each destination address designating a different fading channel.

30. The channel emulator of claim 29 in which said ingress switch logic further includes switch fabric implemented in a GPU for receiving the packet streams from the packetizers and routing packets according to said source and destination addresses to the designated fading channels.

31. The channel emulator of claim 25 in which said egress switch logic further includes addressers associated with each fading channel and implemented in a GPU, each said addresser replaces the source address in the packets with the address of the fading channel for which it is instantiated and replaces the destination address field with the address of at least one designated output port according to a topology configuration.

32. The channel emulator of claim 31 in which said egress switch logic further includes switch fabric implemented in a GPU for routing packets in accordance with source and destination addresses.

33. The channel emulator system of claim 28 further including an IQ depacketizer associated with each output port.

34. The channel emulator system of claim 33 in which each said depacketizer extracts said IQ samples from each packet, sums them in accordance with said time stamp and reassembles said summed IQ samples for delivery to the addressed destination output port.

35. A method of MIMO/OTA channel emulation in a PC computing platform including at least one GPU comprising:
   defining a plurality of fading channels in a said GPU;
   generating complex tap coefficients in a said GPU for said fading channels; and
   emulating an over-the-air field at a device under test (DUT) by coupling a plurality of fading channels into the elements of antenna systems surrounding the DUT; and
   configuring switch logic in said GPU for setting a topology configuration by routing IQ samples from channel emulator input ports to fading channels and from fading channels to channel emulator output ports; and
   further including packetizing IQ samples from each input port.

36. The method of channel emulation of claim 35 in which packetizing includes grouping a data stream of IQ samples into packets and applying a source address, a destination address, and a time stamp to each packet of IQ samples.

37. The method of channel emulation of claim 36 in which said packets are routed according to said source and destination addresses to the designated fading channels.

38. The method of channel emulation of claim 37 in which packets from the fading channels are reconfigured by an addresser implemented in a GPU with the source address of the fading channel and the destination address of at least one designated output port according to a topology configuration.

39. The method of channel emulation of claim 38 in which said packets are routed by switch fabric implemented in a GPU in accordance with said source and destination addresses.

40. The method of channel emulation of claim 39 further including depacketizing IQ samples associated with each output port.

41. The method of channel emulation of claim 40 in which depacketizing includes extracting said IQ samples from each packet, summing them in accordance with the time stamp and reassembling the summed IQ samples for delivery to the addressed output port.

* * * * *